United States Patent
Chung et al.

(10) Patent No.: US 7,174,492 B1
(45) Date of Patent: Feb. 6, 2007

(54) AC COUPLED LINE TESTING USING BOUNDARY SCAN TEST METHODOLOGY

(75) Inventors: Sung Soo Chung, San Jose, CA (US); Sang Hyeon Baeg, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 633 days.

(21) Appl. No.: 09/834,506

(22) Filed: Apr. 12, 2001

(51) Int. Cl.
*G01R 31/28* (2006.01)

(52) U.S. Cl. .................................. 714/727; 714/738

(58) Field of Classification Search ............ 714/727, 714/726, 724, 25, 731, 733, 736, 30, 738; 702/118, 58; 324/715, 512, 603; 712/227; 326/16

See application file for complete search history.

(56) References Cited

U.S. PATENT DOCUMENTS

| | | | | |
|---|---|---|---|---|
| 4,428,060 A * | 1/1984 | Blum | ......................... | 708/209 |
| 4,771,428 A * | 9/1988 | Acuff et al. | ................. | 714/736 |
| 4,994,732 A * | 2/1991 | Jeffrey et al. | .............. | 324/73.1 |
| 5,027,353 A * | 6/1991 | Jarwala et al. | .............. | 714/738 |
| 5,029,166 A * | 7/1991 | Jarwala et al. | .............. | 714/724 |
| 5,072,178 A * | 12/1991 | Matsumoto | .................. | 714/724 |
| 5,130,988 A * | 7/1992 | Wilcox et al. | .............. | 714/727 |
| 5,166,937 A * | 11/1992 | Blecha, Jr. | .................. | 714/733 |
| 5,172,377 A * | 12/1992 | Robinson et al. | ........... | 714/727 |
| 5,260,649 A * | 11/1993 | Parker et al. | ................ | 714/727 |
| 5,321,701 A * | 6/1994 | Raymond et al. | ........... | 714/736 |
| 5,444,715 A * | 8/1995 | Gruetzner et al. | .......... | 714/727 |
| 5,497,378 A * | 3/1996 | Amini et al. | ................ | 714/727 |
| 5,513,188 A * | 4/1996 | Parker et al. | ................ | 714/727 |
| 6,029,261 A * | 2/2000 | Hartmann | ................... | 714/724 |
| 6,219,811 B1 * | 4/2001 | Gruetzner et al. | .......... | 714/726 |
| 6,622,108 B1 * | 9/2003 | De Jong et al. | ............ | 702/118 |
| 6,813,737 B1 * | 11/2004 | Srinivasaiah et al. | ....... | 714/726 |

OTHER PUBLICATIONS

Lee Whetsel, Adapting JTAG for AC Interconnect Testing, 2003 IEEE pp. 641-650.*

* cited by examiner

*Primary Examiner*—Albert Decady
*Assistant Examiner*—Mujtaba K. Chaudry
(74) *Attorney, Agent, or Firm*—Thelen Reid Brown Raysman & Steiner LLP; David B. Ritchie

(57) ABSTRACT

Testing AC coupled interconnects using boundary scan test methodology. Specially designed AC boundary scan cells and boundary scan logic are used. These are compatible with IEEE Standard 1149.1 testing. An AC_EXTEST method is used to determine the reliability of the AC coupled interconnections. The method includes preloading the test stimulus, initiating the AC_EXTEST instruction, executing the instruction, transferring the instruction results, and evaluating the results. During the test, the TAP controllers of both the driving and receiving ICs are held in the Run-Test/Idle state for the time required to complete execution of the instruction. During this time, the driving IC is applying the AC test stimulus to the interconnections and the receiving IC is sampling the signal. The test may be repeated with different test data and may be run together with a DC EXTEST method to determine the reliability of both the AC and the DC coupled interconnections independently.

13 Claims, 15 Drawing Sheets

AC COUPLED LINE TESTING USING BOUNDARY SCAN TEST METHODOLOGY

FIELD OF THE INVENTION

The present invention relates generally to boundary scan testing of interconnections between integrated circuits. More specifically, the present invention relates to AC coupled boundary scan testing.

BACKGROUND OF THE INVENTION

Electronic systems generally include at least one printed circuit board (PCB) containing one or more integrated circuit (IC) chips or ICs. ICs typically include input/output (I/O) pins which may be coupled to various interconnects of the PCB. Testing performance of electronic systems which include PCBs and ICs typically requires testing at multiple levels including at the chip level, at the board level, and at the system level. Testing at the board level includes testing interconnects of the PCB. Testing at the system level requires analysis of interconnections between and among the ICs, the PCBs, and other devices both on and off the PCB.

To enhance testability at the board level as well as at the system level, a common design practice at the chip level is to incorporate boundary scan test logic into an IC in accordance with IEEE Standard 1149.1. 1149.1 specifies the function of JTAG logic, which is named for the Joint Test Action Group, for control of boundary scan testing. Two basic elements of an IC are a core logic and the I/O pins. In accordance with 1149.1, boundary scan cells (BSCs) are inserted between the core logic and the I/O pins of the IC. BSCs are typically inserted for all I/O pins of the plurality of ICs on the PCB and may be used to test the integrity of the interconnections between the plurality of ICs.

Each IC may be controlled by boundary scan logic, in accordance with 1149.1, to operate either in a system mode or in a JTAG test mode. In the system mode, system data signals relating to core functions of the IC are passed through the I/O pins to and from devices external to the IC. In the JTAG test mode, test data are provided by the boundary scan chain for the purpose of testing interconnections between the IC and devices external to the IC. The boundary scan logic also provides test control signals which include mode signals, shift signals, clock signals, and update signals, among others, each of which is well known. The shift control signal instructions include a bypass instruction, a sample instruction, and a cross test instruction. The cross test instruction controls BSCs to perform a boundary scan test among the various ICs.

The IC further includes a test data input (TDI) demultiplexer, a test data output (TDO) multiplexer, a bypass register, an instruction register, an identification register, and a test access port (TAP) controller. The TDI demultiplexer includes an input coupled to receive a test data signal from the boundary scan logic which is typically external to the IC. The TDI demultiplexer includes a first output coupled to a TDI input of a first BSC of the plurality of BSCs in the IC. Each of the BSCs includes a TDI input and a TDO output. Each of BSCs is connected serially from a TDO output to a TDI input to propagate test data signals from one BSC to the next BSC in the chain. The TDI demultiplexer further includes a second output coupled to an input of the core logic, a third output coupled to an input of the bypass register; a fourth output coupled to an input of the instruction register; and a fifth output coupled to an input of the identification register.

The TDO multiplexer includes an output which is coupled to provide a test data signal to another IC or to the boundary scan logic. The TDO multiplexer further includes: a first input coupled to a TDO output of a last BSC of the plurality of BSCs in the IC, a second input coupled to an output of the core logic; a third input coupled to an output of the bypass register; a fourth input coupled to an output of the instruction register, and a fifth input coupled to an output of the identification register. The identification register includes inputs coupled to outputs of the TAP controller. The TAP controller includes inputs coupled to receive a TMS signal, a TCK signal, and a TRST signal from the boundary scan logic.

In general, there are three possible I/O structures for an IC including a two-state I/O structure, a three-state I/O structure, and a bi-directional I/O structure. Each of the three I/O structures provides coupling between the core logic and at least one I/O pin. Any or all of the I/O structures may be used in an IC depending on the particular circumstances. The two-state I/O structure includes a two-state output buffer having an input and an output. The input of the two-state output buffer is coupled to a system data output of the core logic. The output of the two-state output buffer is coupled to an I/O pin. The three-state I/O structure includes a three-state output buffer having an input, an output, and a control input. The input of the three-state output buffer is coupled to a system data output of the core logic. The output of the three-state output buffer is coupled to an I/O pin. The control input of the three-state output buffer is coupled to a three-state system control signal output line of the core logic. The bi-directional I/O structure includes a bi-directional buffer. The bi-directional buffer includes an output buffer element having an input, an output, and a control input and an input buffer element having an input and an output. The control input of the output buffer element is coupled to a bi-directional control signal output line of the core logic. The input of the output buffer element is coupled to a system data output of the core logic. The output of the input buffer element is coupled to a system data received input of the core logic. The output of the output buffer element and the input of the input buffer element are coupled together with an I/O pin.

According to conventional methods and apparatus for boundary scan testing, the BSCs are inserted into the I/O structures between the buffers and the core logic. For a two-state output structure, a BSC is inserted between the core logic and the input of the two-state output buffer. For a three-state output structure, a BSC is inserted between the system data output of the core logic and the input of the three-state output buffer. Also, a BSC is inserted between the three-state control signal output line of the core logic and the control input of the three-state output buffer. For a bi-directional output structure, a BSC is inserted between the system control signal output line of the core logic and the bi-directional output buffer. Also, a bi-directional BSC is inserted between the core logic and the bi-directional output buffer.

Turning first to FIG. 1, a detailed logic block diagram of a prior art BSC 10 is shown. The BSC 10 includes a boundary scan mode multiplexer (mode multiplexer) 12; a shift multiplexer 14, a data shift/capture register 16, and an update data register 18. The mode multiplexer 12 and the shift multiplexer 14 each have a system input (0), an update input (1), an output, and a select line. The data shift/capture register 16 and the update data register 18 each have a data input (D), a clock input (CLK), a normal output (Q), and an inverted output (Q bar or not Q).

The BSC 10 includes a system data input (SDI) line for receiving system signals including system data signals and system control signals from the system signal output lines, including the system data signal output lines and the system control signal output lines, of the core logic. If the BSC 10 is used for control purposes, the SDI line may receive a system control signal from the core logic. If the BSC 10 is used for output, the SDI line may receive a system data signal from the core logic. If the BSC 10 is used for an input, the SDI line becomes a system data received input (SDRI) line for receiving signals from the I/O pin through an input buffer. The BSC 10 also includes a system data output (SDO) line for transmitting signals through an output buffer to the I/O pin. If the BSC 10 is used for an input, the SDO line becomes a system data received output (SDRO) line for transmitting signals to the core logic. The SDI line and the SDO line complete the circuit between the core logic and the I/O structure that was bisected by the insertion of the BSC.

For control of the mode of operation by the boundary scan logic and for various test inputs from the boundary scan logic, the BSC 10 further includes a number of JTAG lines. Part or all of these lines taken collectively are sometimes referred to as forming a JTAG bus. The primary JTAG lines are a TDI line which may receive a TDI signal from the boundary scan logic either directly or via another BSC and a TDO line for providing a TDO signal to the boundary scan logic either directly or via another BSC. These two lines are common to all types of BSCs as they are used to form the chain of BSCs. The JTAG lines further include a ShiftDR signal input line, a ClockDR signal input line, an UpdateDR signal input line, and a Mode signal input line. Each line is coupled to receive the corresponding signal from the boundary scan logic. The various lines and circuit elements are coupled to one another as shown.

Turning now to FIG. 2, a detailed logic block diagram of a prior art bi-directional BSC 20 is shown. The bi-directional BSC 20 includes a bi-directional system multiplexer 22, a direction control multiplexer 24, a bi-directional shift control multiplexer 26, a bi-directional data shift/capture register 28, and a bi-directional update data register 30. The bi-directional system multiplexer 22, the direction control multiplexer 24, and the bi-directional shift control multiplexer 26 each have a system input (0), an update input (1), an output, and a select line. The bi-directional data shift/capture register 28 and the bi-directional update data register 30 each have a data input (D), a clock input (CLK), a normal output (Q), and an inverted output (Q bar or not Q).

Since the bi-directional BSC 20 serves both as an output and an input, it includes an SDI line, an SDO line, an SDRI line, and an SDRO line as described above. Similarly, the bi-directional BSC 20 includes a TDI line, a TDO line, a ShiftDR signal input line, a ClockDR signal input line, an UpdateDR signal input line, and a Mode signal input line. In addition, the bi-directional BSC 20 includes a DIRCTL signal input line. Each line is coupled to receive the corresponding signal from the boundary scan logic. The various lines and circuit elements are coupled to one another as shown.

IEEE Standard 1149.1 was first adopted in 1990. It has been widely used and has proved to be very successful. 1149.1 has been amended once to improve it. However, 1149.1 does not address all situations and design practices. One such practice is the inclusion of capacitive coupling in the interconnections between ICs. A capacitor is added either to the connection between the ICs or to one, the other, or both of the I/O pins of the ICs or the PCBs with connectors. The capacitor is designed to reduce noise and block unwanted common mode voltage differences in the interconnection. For discussion, this will be referred to alternatively as either being AC coupled or DC de-coupled.

Turning now to FIG. 3, a block diagram of ten possible combinations of DC and AC coupled interconnections between two devices is shown. The choice of which of the combinations shown that are actually used depends on the circumstances. Because of the capacitor, the value of a signal at the receiving end of the interconnection is no longer the same as the value at the driving end. The result is that conventional 1149.1 testing becomes impractical on AC coupled interconnections. One will note that there are seven possible AC coupled combinations where 1149.1 will not work as compared to only three DC coupled combinations where 1149.1 will work. As the quest for higher signal speeds continues in the future, the use of AC coupling will increase. This becomes especially true with the development of optical communication signals. The consequence will be less and less reliance on conventional 1149.1 testing.

A definite need exists for a boundary scan testing means for AC coupled interconnections that builds on the advantages of conventional 1149.1 testing. Specifically, a need exists for a boundary scan testing means which is capable of testing both DC and AC coupled interconnections. Ideally, such a testing means would be backward compatible, robust, and inexpensive. A primary purpose of the present invention is to solve these needs and provide further, related advantages.

BRIEF DESCRIPTION OF THE INVENTION

A system for and method of testing AC coupled interconnects using boundary scan test methodology is disclosed. Specially designed AC boundary scan cells and boundary scan logic are used. These are intended to be compatible with conventional IEEE Standard 1149.1 testing. A method known as AC_EXTEST is used to determine the reliability of the AC coupled interconnections. The method includes preloading the test stimulus, initiating the AC_EXTEST instruction, executing the AC_EXTEST instruction, transferring the AC_EXTEST instruction results, and evaluating the AC_EXTEST results. During the test, the TAP controller of both the driving IC and the receiving IC is held in the Run-Test/Idle state for the time required to complete execution of the instruction. During this controller state, the driving IC is applying the AC test stimulus to the interconnections and the receiving IC is sampling the signal. The test may be repeated with different test data and may be run together with a conventional DC EXTEST method to determine the reliability of both the AC and the DC coupled interconnections independently.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
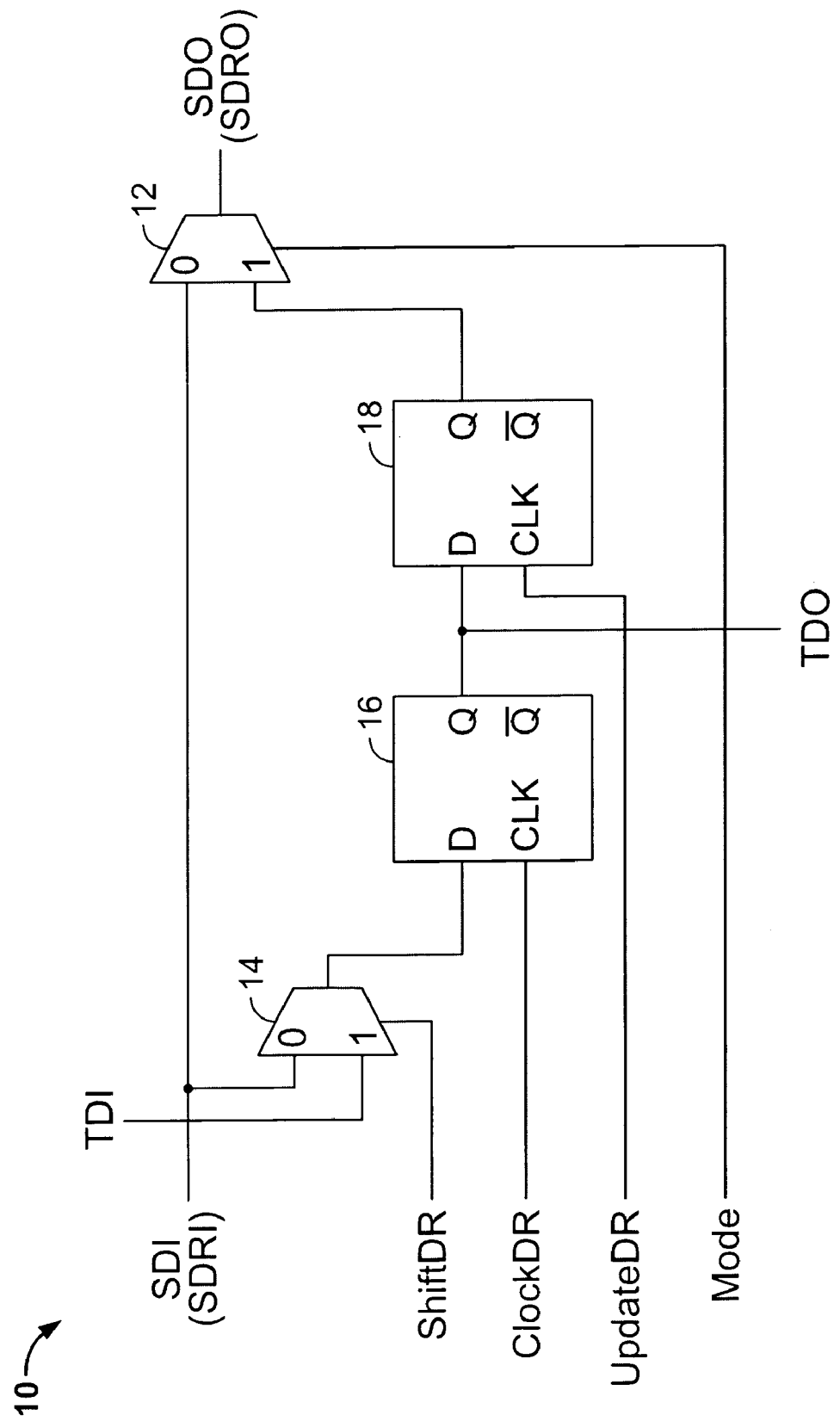
FIG. 1 is a detailed logic block diagram of a prior art BSC.
Figure 2:
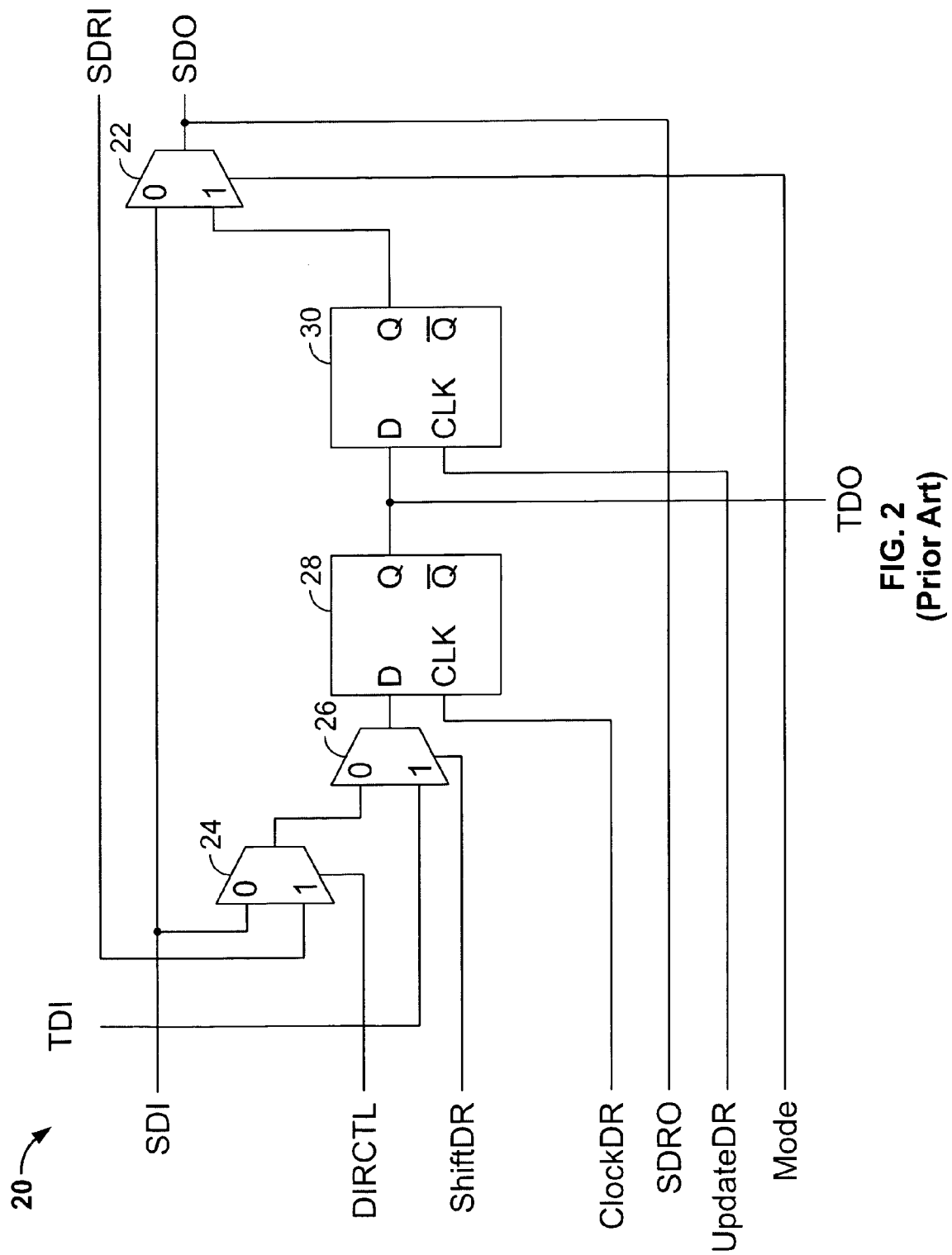
FIG. 2 is a detailed logic block diagram of a prior art bi-directional BSC.
Figure 3:
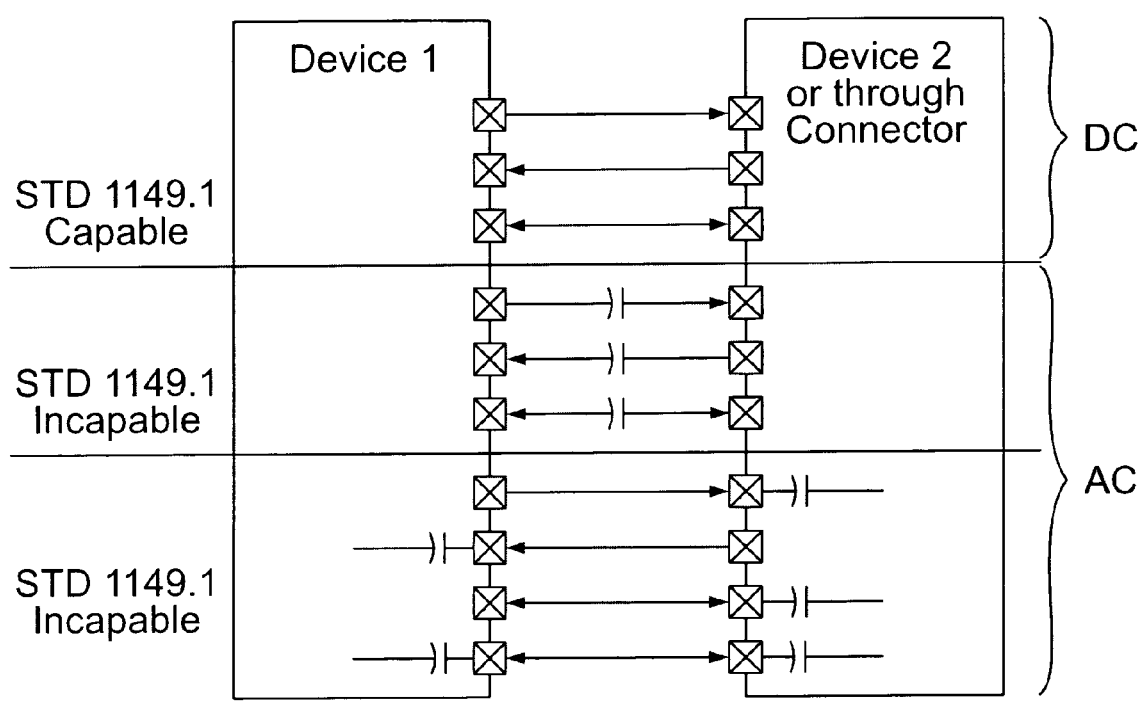
FIG. 3 is a block diagram of ten possible combinations of DC and AC coupled interconnections between two devices.

Embodiments of the present invention are described herein in the context of AC coupled line testing using boundary scan test methodology. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the specific goals of the developer, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

To the extent applicable, in accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Included among the various testing methods of conventional 1149.1 boundary scan logic is one known as EXTEST. During the EXTEST method, a value, either logic one or logic zero, is loaded onto the latched parallel outputs of the update data registers of the BSCs of the driving IC using a PRELOAD instruction or is loaded with a ShiftDR state while the IC is in the EXTEST instruction. The value being driven is then sampled by the input BSCs of the receiving IC when the TAP controller passes through a CaptureDR state. Finally, by serially shifting out and examining the captured values, one can determine the reliability of the interconnections. This process assumes that the logic value during the time of capture is a static DC value. As noted above, this assumption only holds if the interconnections are DC coupled. As a result, the EXTEST method fails to test AC coupled interconnections.

To address the failure of conventional 1149.1 boundary scan logic in general and the EXTEST method more specifically, the following design specification was developed. In order to deal with AC coupled interconnections, it was necessary to change both the boundary scan logic and the BSCs themselves. Nevertheless, every effort was made to design the changes to be backward compatible with conventional testing. As a result, most of the details which are not outlined here are the same as those for conventional testing. For reference purposes, the testing method is known as AC_EXTEST and the BSCs are known as AC or AC capable BSCs. All of the BSCs outlined below are AC BSCs whether or not they are specifically identified as such.

Figure 4:
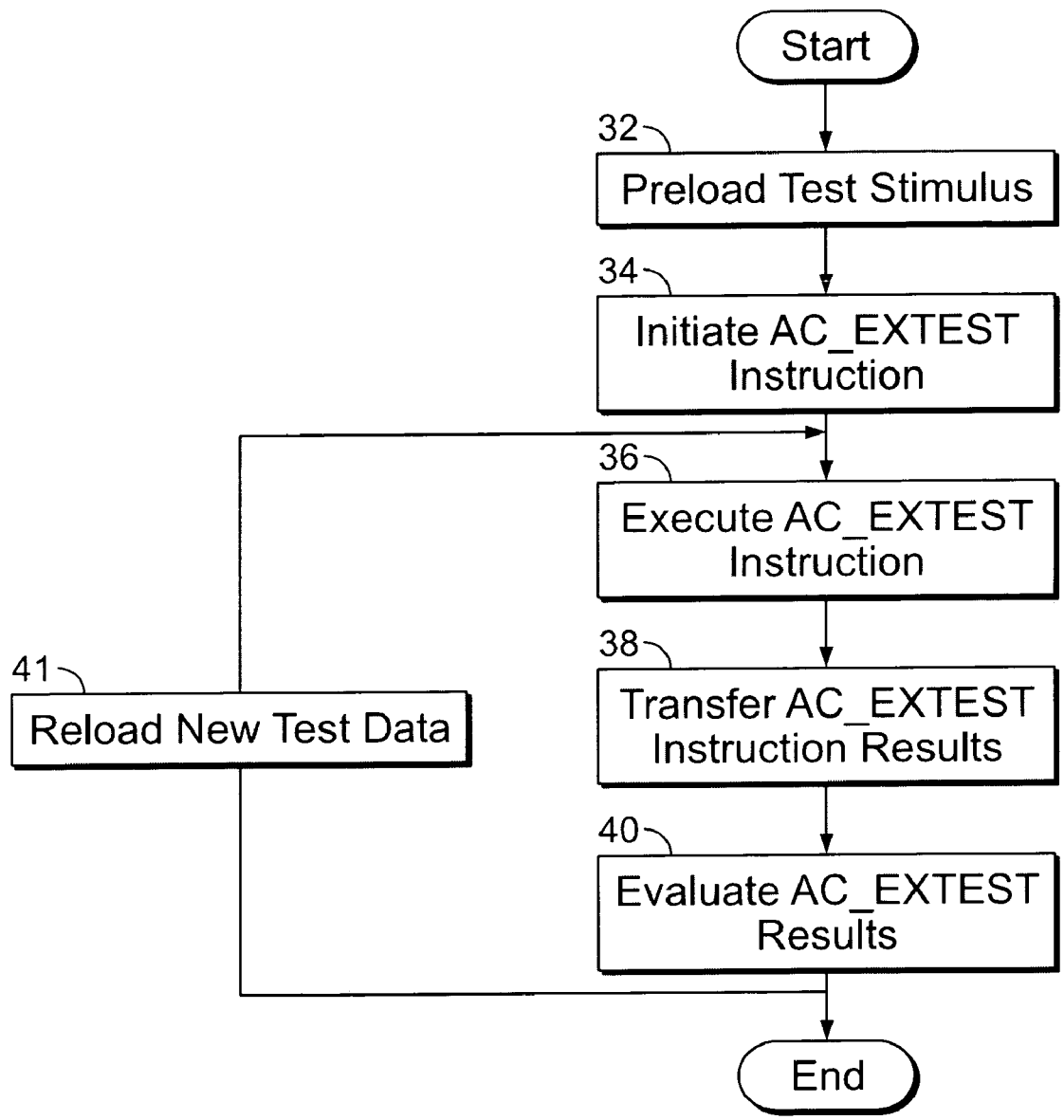
FIG. 4 is a logic flow diagram of the AC_EXTEST test method.

Turning now to FIG. 4, a logic flow diagram of the AC_EXTEST test method is shown. In the interest of clarity, it will be assumed that the method is being performed on a circuit only having one driving IC and one receiving IC that are couple together by at least one AC interconnection. The principles disclosed below can easily be extrapolated to larger circuits by one of ordinary skill in the art. At block 32, an AC test stimulus is shifted into the BSCs of the driving IC using the PRELOAD instruction. At block 34, an initiate AC_EXTEST instruction is scanned into the instruction register of both ICs. Taken together, blocks 32 and 34 prepare the ICs for their respective test roles. At block 36, an execute AC_EXTEST instruction is performed by moving the TAP controller to the Run-Test/Idle state. The TAP controller of both ICs is held in the Run-Test/Idle state for the time required to complete execution of the instruction. During this controller state, the driving IC is applying the AC test stimulus to the interconnections and the receiving IC is sampling the signal. The form and timing of the various signals will be discussed further with respect to FIG. 5 below. At block 38, the AC_EXTEST instruction results are transferred into the BSCs of the receiving IC from the sampled value. This occurs when the TAP controller passes from the Run-Test/Idle state to the CaptureDR state. At block 40, the AC_EXTEST results are evaluated. The captured results are scanned out in a conventional manner by placing the TAP controller in the ShiftDR state. As with the EXTEST above, the scanned results are evaluated to determine the reliability of the AC coupled interconnections. At block 41, new test data may be loaded and blocks 36 through 40 repeated. For example, this enables different test data to be used for one test run for logic one and one for logic zero. The AC_EXTEST method may be run independently or together with the DC EXTEST method to determine the reliability of both the AC and the DC coupled interconnections independently.

Figure 5:
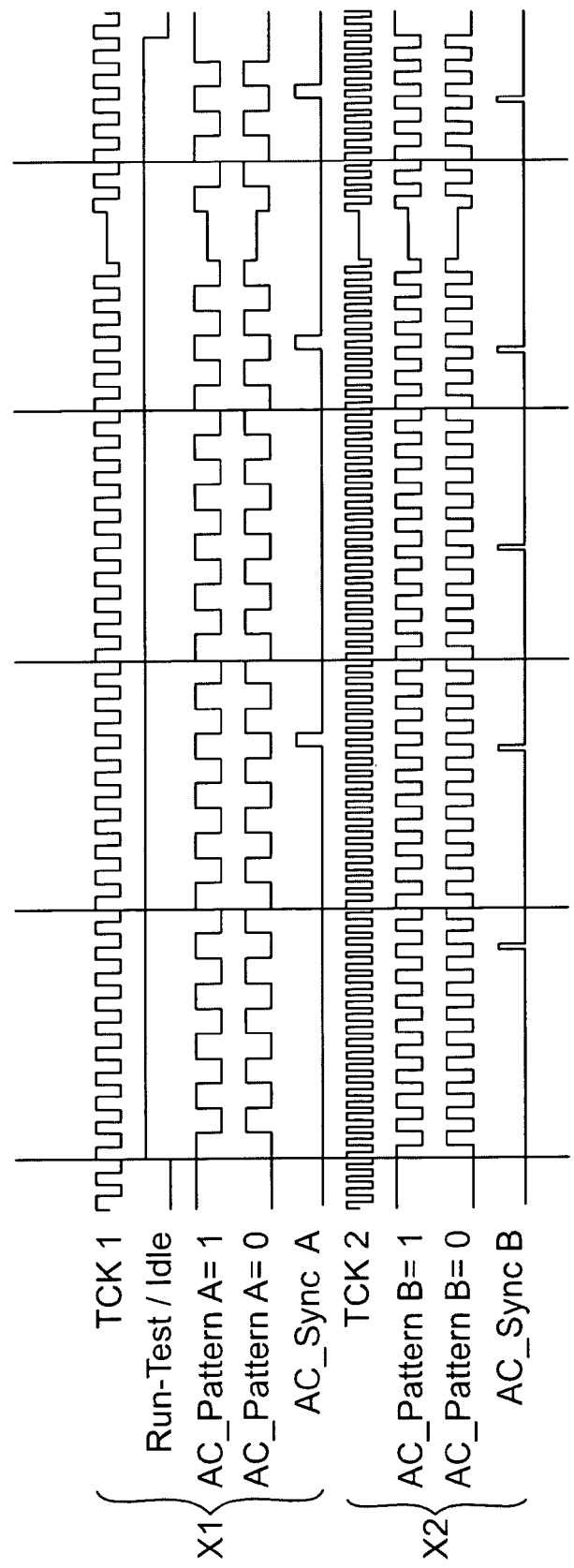
FIG. 5 shows two example timing diagrams for some of the signals used in the AC_EXTEST method.

Turning now to FIG. 5, two example timing diagrams for some of the signals used in the AC_EXTEST method are shown. One group of signals has been labeled collectively as X1, that is, times one, and labeled individually as either 1 or A. The other group of signals has been labeled collectively as X2, that is, times two of those of group X1, and labeled individually as either 2 or B. The Run-Test/Idle signal is independent of either group. Recall from above that the AC_EXTEST method executes when the Run-Test/Idle signal is high. The TCK signal is a clock signal that may be either the boundary scan clock signal or another clock, such as a AC_Pattern_Clock signal, running at a higher rate. Example AC_Pattern signals are shown for logic one and logic zero. The AC_Sync signal goes high every sixteenth clock cycle on the falling edge of the clock cycle. It is at this time that the receiving IC samples the test stimulus as discussed above. The generation and use of the AC_Sync signal may not be necessary depending on the circumstances outlined below. Actual AC_Pattern signals may differ from the examples shown. In any case, the logic value of the AC_Pattern signals at the time when the AC_Sync signal is occurring should be the same value as the latched parallel output of the update register value of the AC BSC.

There are other signals used in the AC_EXTEST method that are not shown in FIG. 5. Some of the signals are conventional signals that have simply been relabeled, such as Mode to DC_Mode, to better identify them or to distinguish them from new and existing signals. Others are new signals such as an AC_Test signal which becomes true when the TAP controller is in the Run-Test/Idle state with the execute AC_EXTEST instruction loaded in the instruction register.

Figure 6:
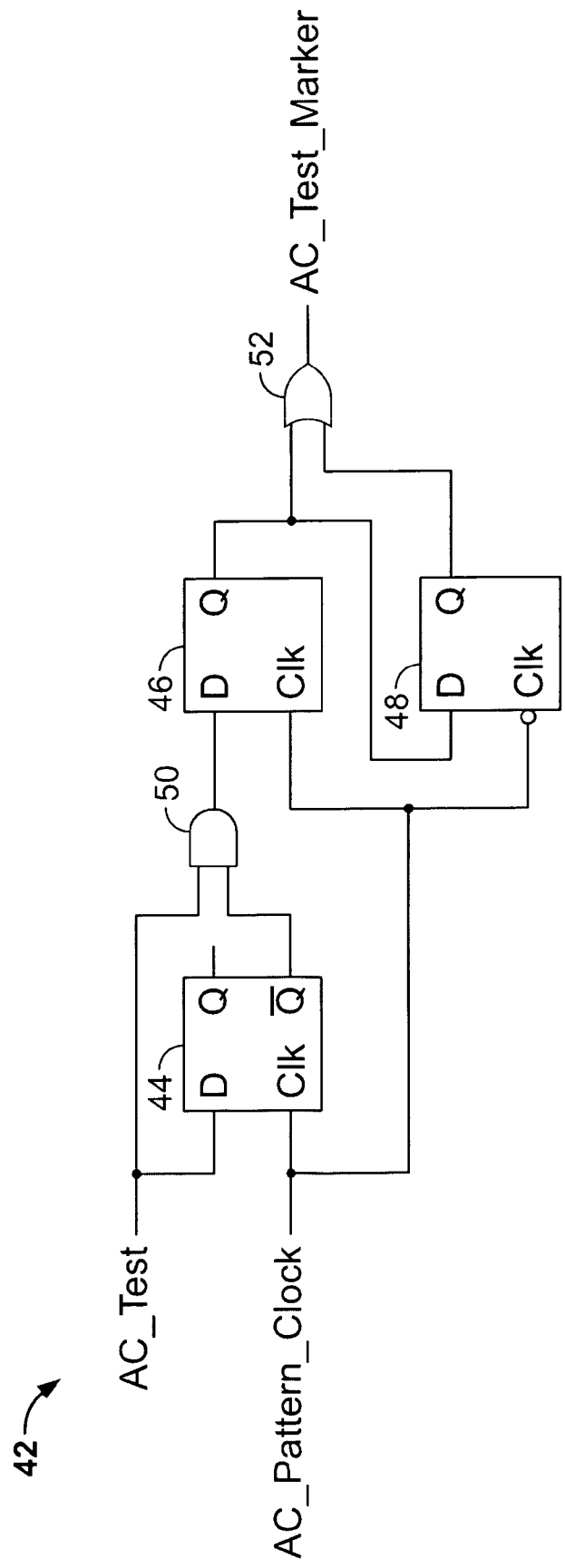
FIG. 6 is a detailed logic block diagram of an AC_Test_Marker signal generator.

Turning now to FIG. 6, a detailed logic block diagram of an AC_Test_Marker signal generator 42 is shown. The generator 42 includes a first shift register 44, a second shift register 46, a third shift register 48, an AND gate 50, and an OR gate 52. The generator 42 has as inputs an AC_Test signal line and an AC_Pattern_Clock signal line and has as an output an AC_Test_Marker signal line. The various lines and circuit elements are coupled to one another as shown. The AC_Test_Marker signal is a single event, one and one half AC_Pattern_Clock cycle long, and positive going pulse to mark the beginning of the AC_Pattern signal sequences. The extra one half cycle acts to block any unwanted problems caused by changing TCK during the AC_Pattern_Clock switching.

Figure 7:
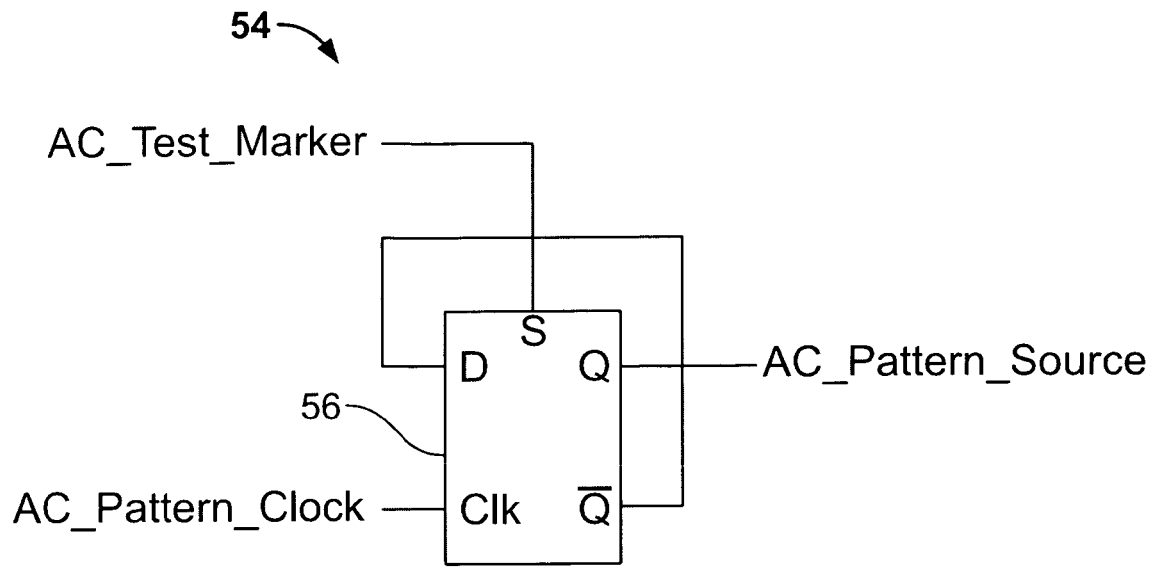
FIG. 7 is a detailed logic block diagram of an AC_Pattern_Source signal generator.

Turning now to FIG. 7, a detailed logic block diagram of an AC_Pattern_Source signal generator 54 is shown. The generator 54 includes a shift register 56. The generator 54 has as inputs an AC_Test_Marker signal line and an AC_Pattern_Clock signal line and has as an output an AC_Pattern_Source signal line. The various lines are coupled as shown. The AC_Test_Marker signal is used to set the shift register 56 to a known value. Subsequently, the AC_Pattern_Clock signal becomes the AC_Pattern_Source signal and is used to generate appropriate signal pattern sequences for each BSC depending on the value stored in the respective update data register.

Figure 8:
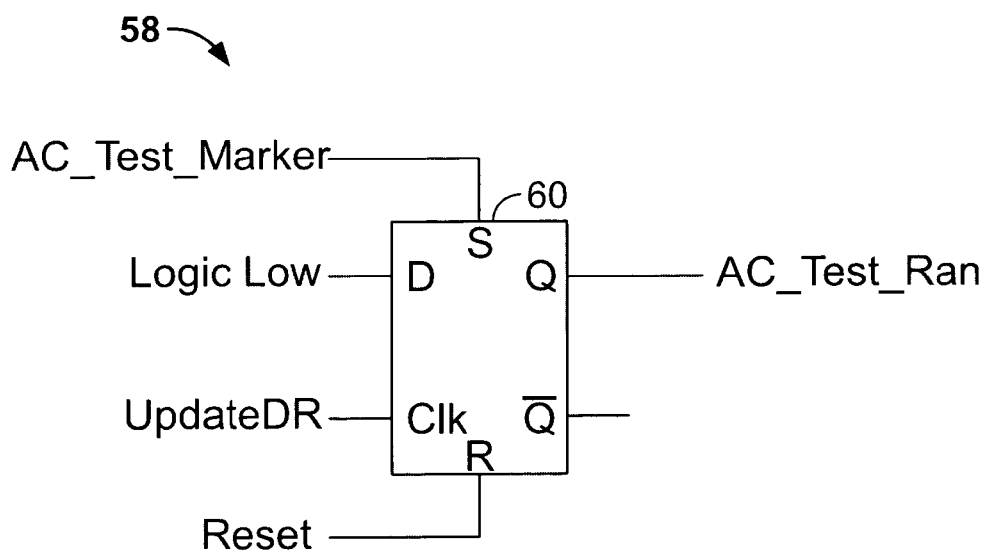
FIG. 8 is a detailed logic block diagram of an AC_Test_Ran signal generator.

Turning now to FIG. 8, a detailed logic block diagram of an AC_Test_Ran signal generator 58 is shown. The generator 58 includes a shift register 60. The generator 58 has as inputs an AC_Test_Marker signal line, a Logic Low signal line, an UpdateDR signal line, and a Reset signal line and has as an output an AC_Test_Ran signal line. The various lines are coupled as shown. The AC_Test_Marker signal is used to set the shift register 60 to a known value. For example, setting the value to a logic one signifies that the execute AC_EXTEST instruction is being or was previously loaded in the instruction register with the TAP controller in the Run-Test/Idle state. The value is cleared when the UpdateDR signal or the Reset signal is received signifying that the execute AC_EXTEST instruction has been performed and that the TAP controller has been placed into the CaptureDR and subsequent UpdateDR states. With the AC_Test_Ran signal one can perform DC EXTEST functions with the AC_EXTEST instructions when the AC_Test_Ran signal is not set.

Under the AC_EXTEST method, the signals outlined above, among others, a modified AC TAP controller, and the AC BSCs outlined below are utilized to add AC coupled line testing capability to the conventional boundary scan logic. Several AC BSCs will be disclosed. One of ordinary skill in the art will realize that any combination of AC and DC BSCs may be used depending on the circumstances.

Figure 9:
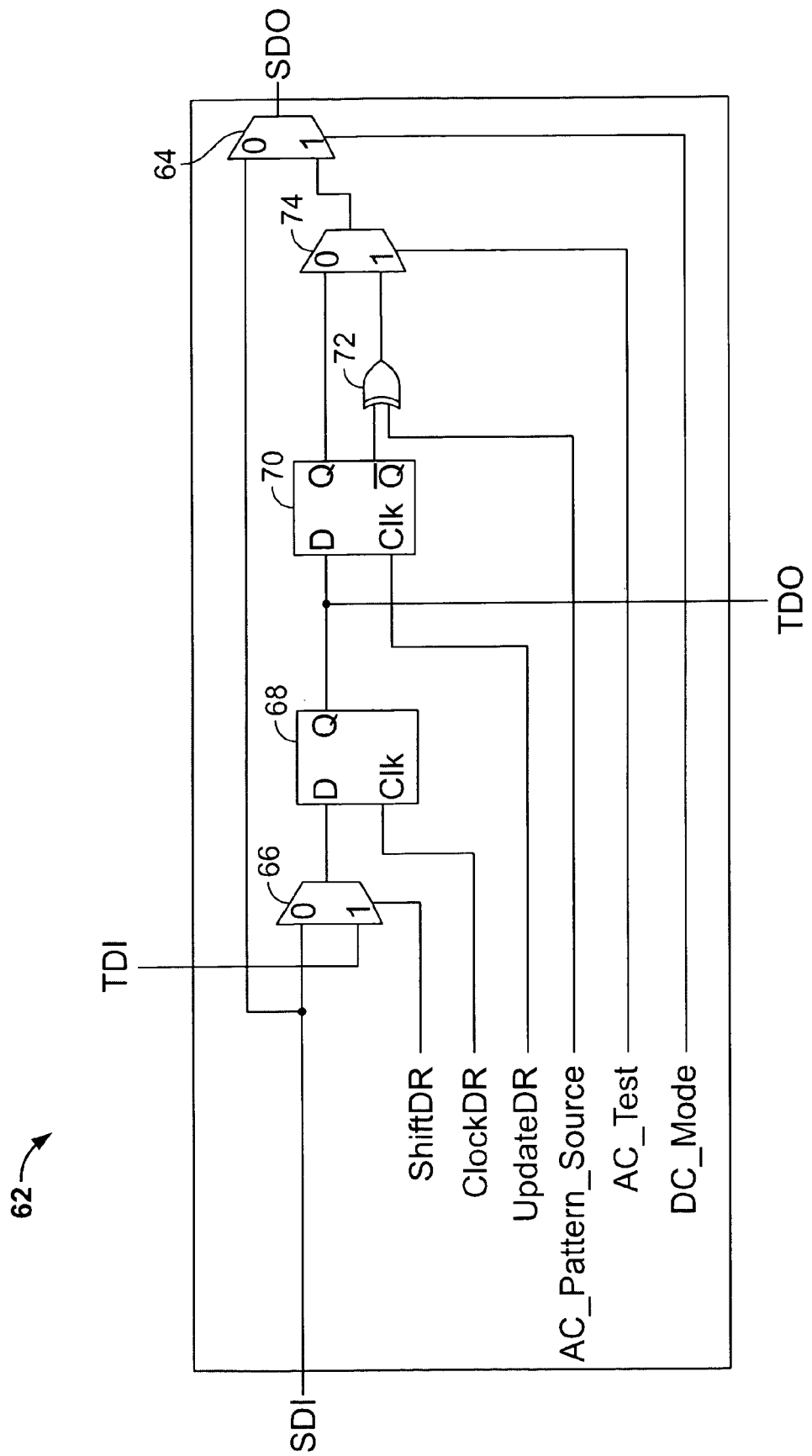
FIG. 9 is a detailed logic block diagram of an AC BSC according to one embodiment of the present invention.

Turning now to FIG. 9, a detailed logic block diagram of an AC BSC 62 according to one embodiment of the present invention is shown. The BSC 62 includes a first multiplexer 64, a second multiplexer 66, a first data shift register 68, a second data register 70, a XOR logic gate 72, and a third multiplexer 74. As above, the BSC 62 includes an SDI line, an SDO line, a TDI line, a TDO line, a ShiftDR signal input line, an AC_Pattern_Clock or ClockDR signal input line, an UpdateDR signal input line, and a Mode signal input line, shown here as DC_Mode. In addition, the BSC 62 includes an AC_Pattern_Source signal input line and an AC_Test signal input line. Each line is coupled to receive the corresponding signal from the boundary scan logic. The various lines and circuit elements are coupled to one another as shown. The AC_Pattern_Clock signal is a shared clock signal for AC pattern generation and for capturing and shifting boundary scan test signals. The latter function is similar to the conventional ClockDR signal. The AC_Pattern_Source signal is used directly without inversion when the second data register 70 has a test value of logic one and is used after inversion when the second data register 70 has a test value of logic zero. The function of logic inversion is accomplished by the use of the XOR gate 72.

Figure 10:
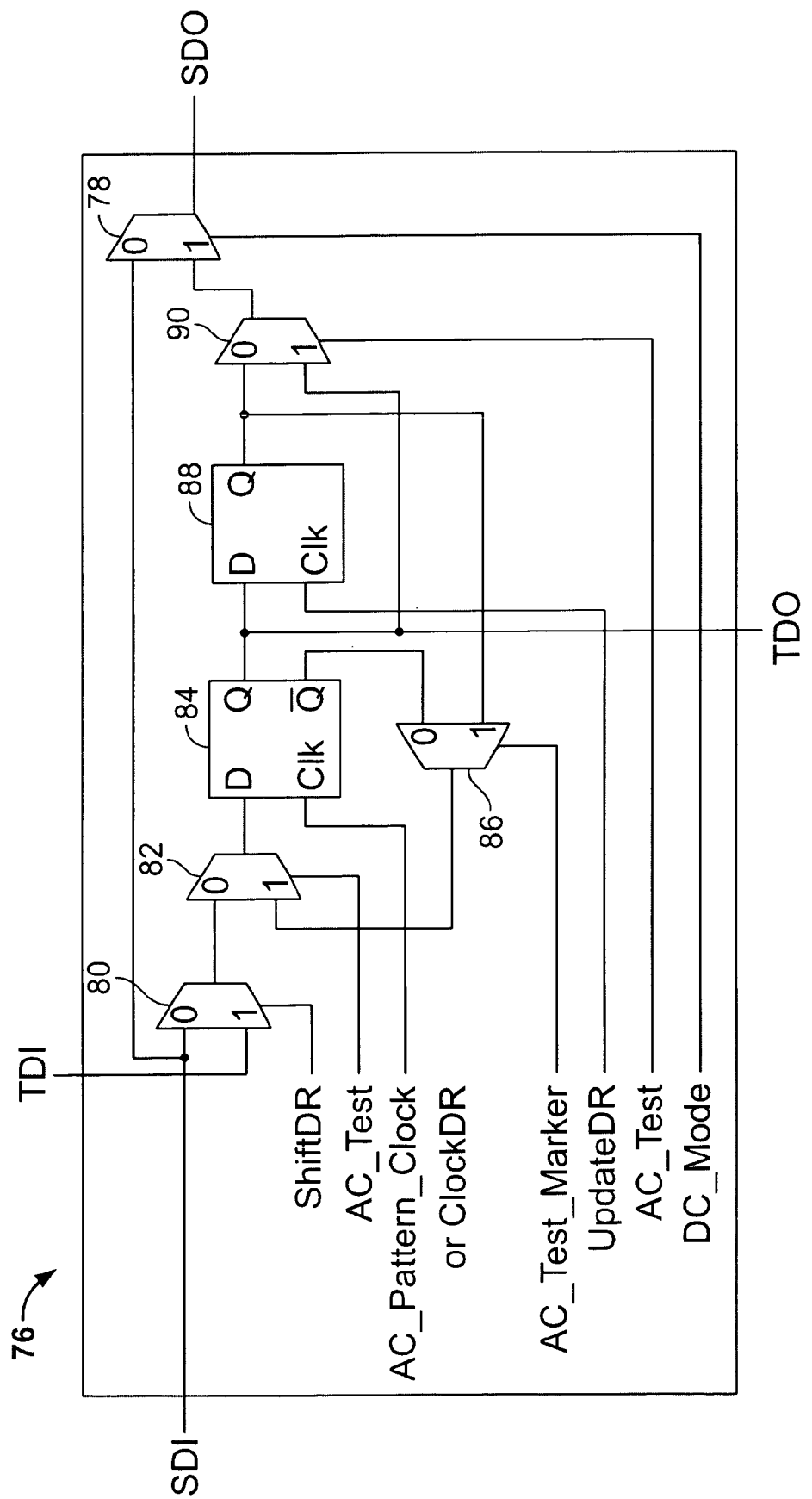
FIG. 10 is a detailed logic block diagram of an AC BSC according to one embodiment of the present invention.

Turning now to FIG. 10, a detailed logic block diagram of an AC BSC 76 according to one embodiment of the present invention is shown. The BSC 76 includes a first multiplexer 78, a second multiplexer 80, a third multiplexer 82, a first data shift register 84, a fourth multiplexer 86, a second data register 88, and a fifth multiplexer 90. As above, the BSC 76 includes an SDI line, an SDO line, a TDI line, a TDO line, a ShiftDR signal input line, an AC_Test signal input line, a AC_Pattern_Clock or ClockDR signal input line, an UpdateDR signal input line, and a DC_Mode signal input line. In addition, the BSC 76 includes an AC_Test_Marker signal input line. Each line is coupled to receive the corresponding signal from the boundary scan logic. The various lines and circuit elements are coupled to one another as shown. In this embodiment, the BSC 76 has a built-in AC pattern generator. First the output value Q from the second data register 88 is copied into the input D of the first data shift register 84 using the AC_Test_Marker signal and the AC_Pattern_Clock signal. Subsequently, the AC_Pattern_Clock signal starts to generate the AC patterns for testing. After the initial copy of data register 88 is made, the third multiplexer 82 selects the Q bar output of the first datashift register 84, thus enabling the first data shift register 84 to toggle the value every AC_Pattern_Clock cycle.

Figure 11:
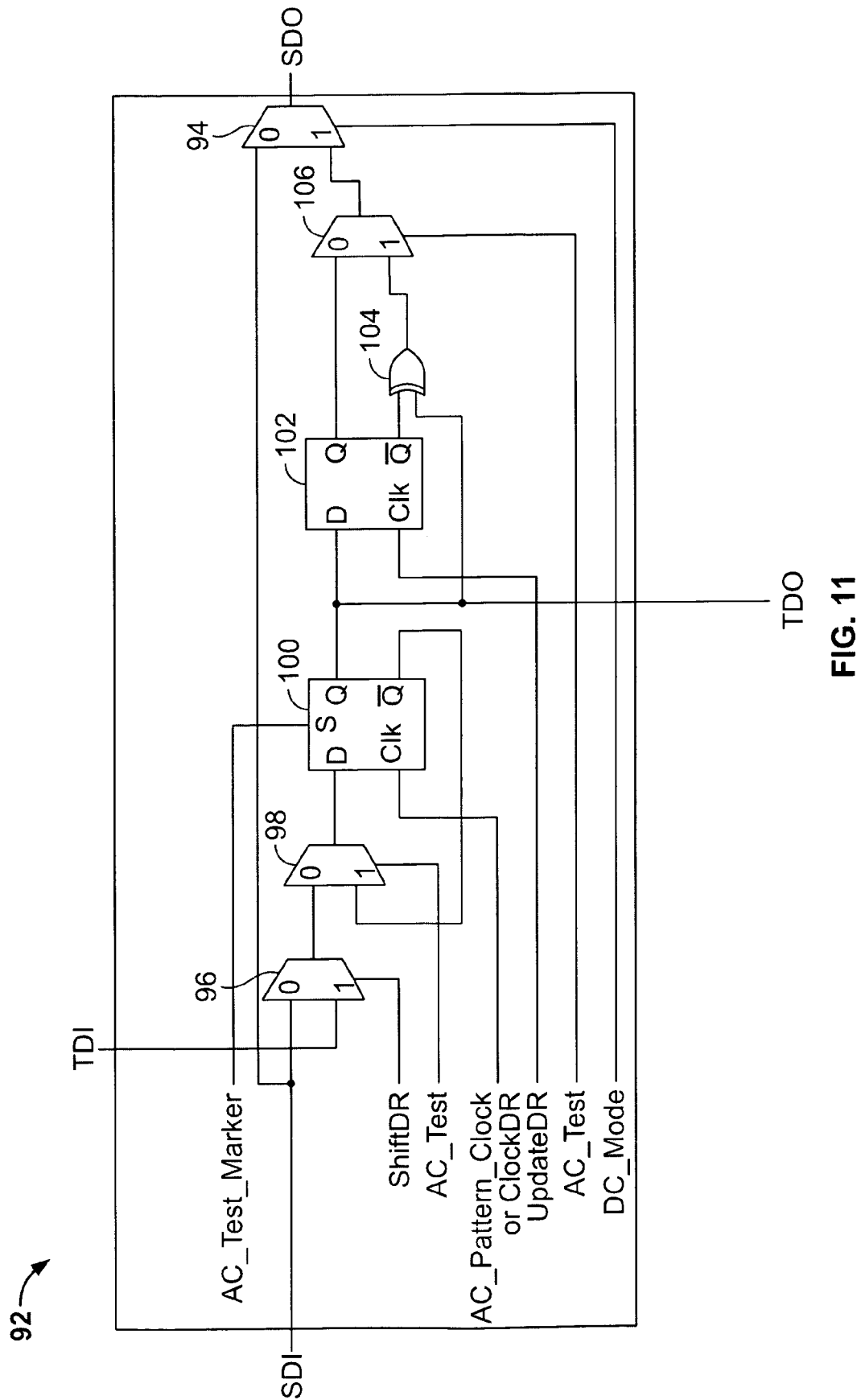
FIG. 11 is a detailed logic block diagram of an AC BSC according to one embodiment of the present invention.

Turning now to FIG. 11, a detailed logic block diagram of an AC BSC 92 according to one embodiment of the present invention is shown. The BSC 92 includes a first multiplexer 94, a second multiplexer 96, a third multiplexer 98, a first data shift register 100, a second data register 102, a XOR logic gate 104, and a fourth multiplexer 106. As above, the BSC 92 includes an SDI line, an SDO line, a TDI line, a TDO line, an AC_Test_Marker signal input line, a ShiftDR signal input line, an AC_Test signal input line, an AC_Pattern_Clock or ClockDR signal input line, an UpdateDR signal input line, and a DC_Mode signal input line. Each line is coupled to receive the corresponding signal from the boundary scan logic. The various lines and circuit elements are coupled to one another as shown. As with the BSC 76 of FIG. 10, the BSC 92 has a built-in AC pattern generator. However, in this embodiment, the AC_Test_Marker signal is used to set the first data shift register 100 into a known state before generating the AC patterns.

Figure 12:
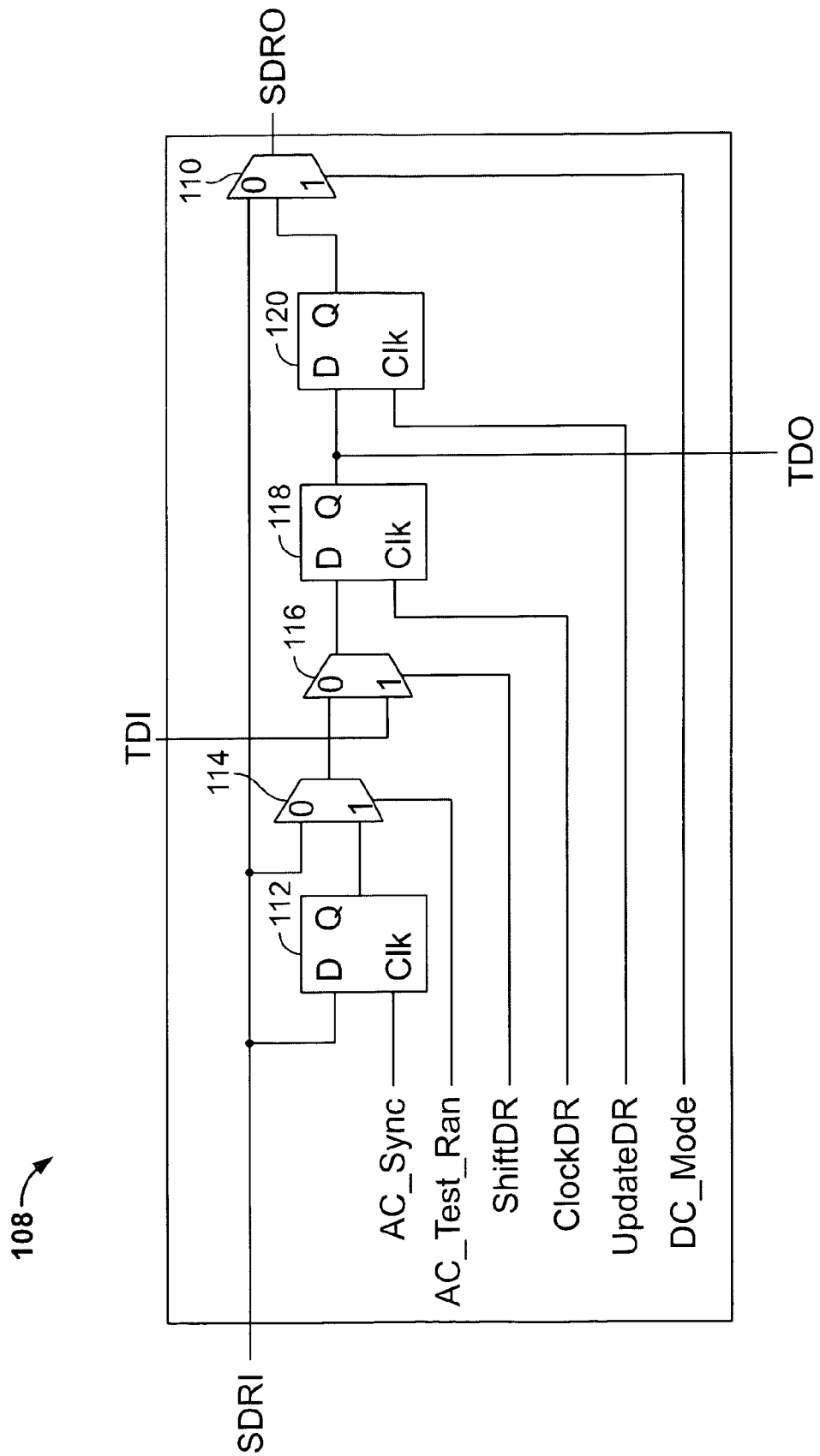
FIG. 12 is a detailed logic block diagram of an input AC BSC according to one embodiment of the present invention.

Turning now to FIG. 12, a detailed logic block diagram of an input AC BSC 108 according to one embodiment of the present invention is shown. The BSC 108 includes a first multiplexer 110, a first data shift register 112, a second multiplexer 114, a third multiplexer 116, a second data register 118, and a third data shift register 120. In this embodiment, the BSC 108 is an input scan cell so it includes an SDRI line instead of an SDI line and an SDRO line instead of and SDO line. As above, the BSC 108 includes a TDI line, a TDO line, a ShiftDR signal input line, a ClockDR signal input line, an UpdateDR signal input line, and a DC_Mode signal input line. In addition, the BSC 108 includes an AC_Sync signal input line and an AC_Test_Ran signal input line. Each line is coupled to receive the corresponding signal from the boundary scan logic. The various lines and circuit elements are coupled to one another as shown. In the BSC 108, when the AC_Test_Ran signal becomes active, signifying that the execute AC_EXTEST instruction was loaded in the instruction register with the TAP controller is in the Run-Test/Idle state, the second data register 118 captures sampled AC pattern values from the first data shift register 112 which is responsive to the AC_Sync signal. When the AC_Test_Ran signal is not active, the second data register 118 captures values from the SDRI line signifying that the test was either DC EXTEST or AC_EXTEST without passing through the Run-Test/Idle controller state. This ensures compatibility with the existing DC EXTEST method.

Figure 13:
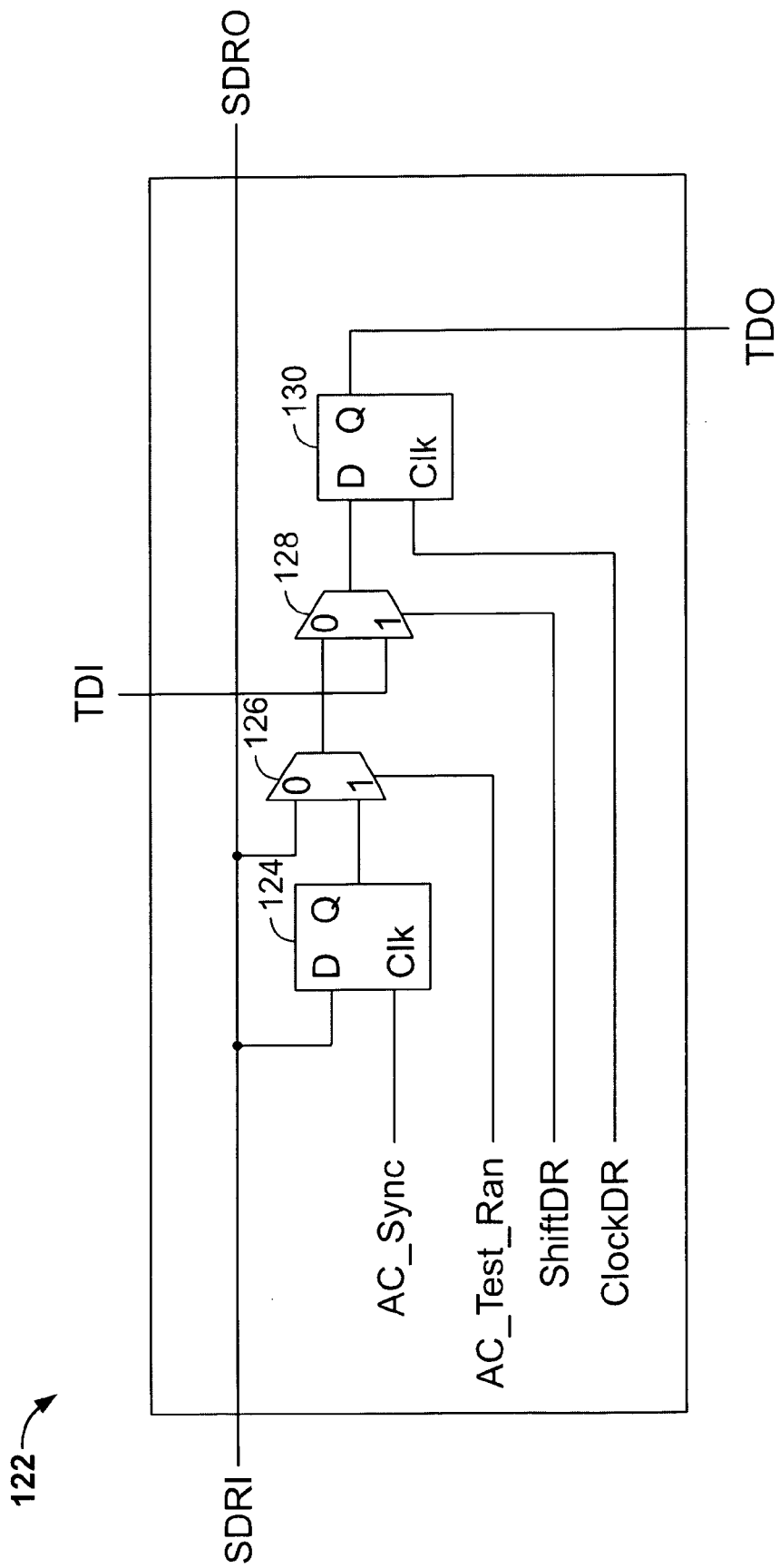
FIG. 13 is a detailed logic block diagram of an input AC BSC according to one embodiment of the present invention.

Turning now to FIG. 13, a detailed logic block diagram of an input AC BSC 122 according to one embodiment of the present invention is shown. The BSC 122 includes a first data shift register 124, a first multiplexer 126, a second multiplexer 128, and a second data register 130. As with the BSC 108 of FIG. 12, the BSC 122 is an input scan cell so it includes an SDRI line and an SDRO line. However, in this embodiment, the BSC 122 is an observe only input scan cell so there is no bisecting of the SDRI line from the SDRO line. As above, the BSC 122 includes a TDI line, a TDO line, an AC_Sync signal input line, an AC_Test_Ran signal input line, a ShiftDR signal input line, and a ClockDR signal input line. Each line is coupled to receive the corresponding signal from the boundary scan logic. The various lines and circuit elements are coupled to one another as shown.

Figure 14:
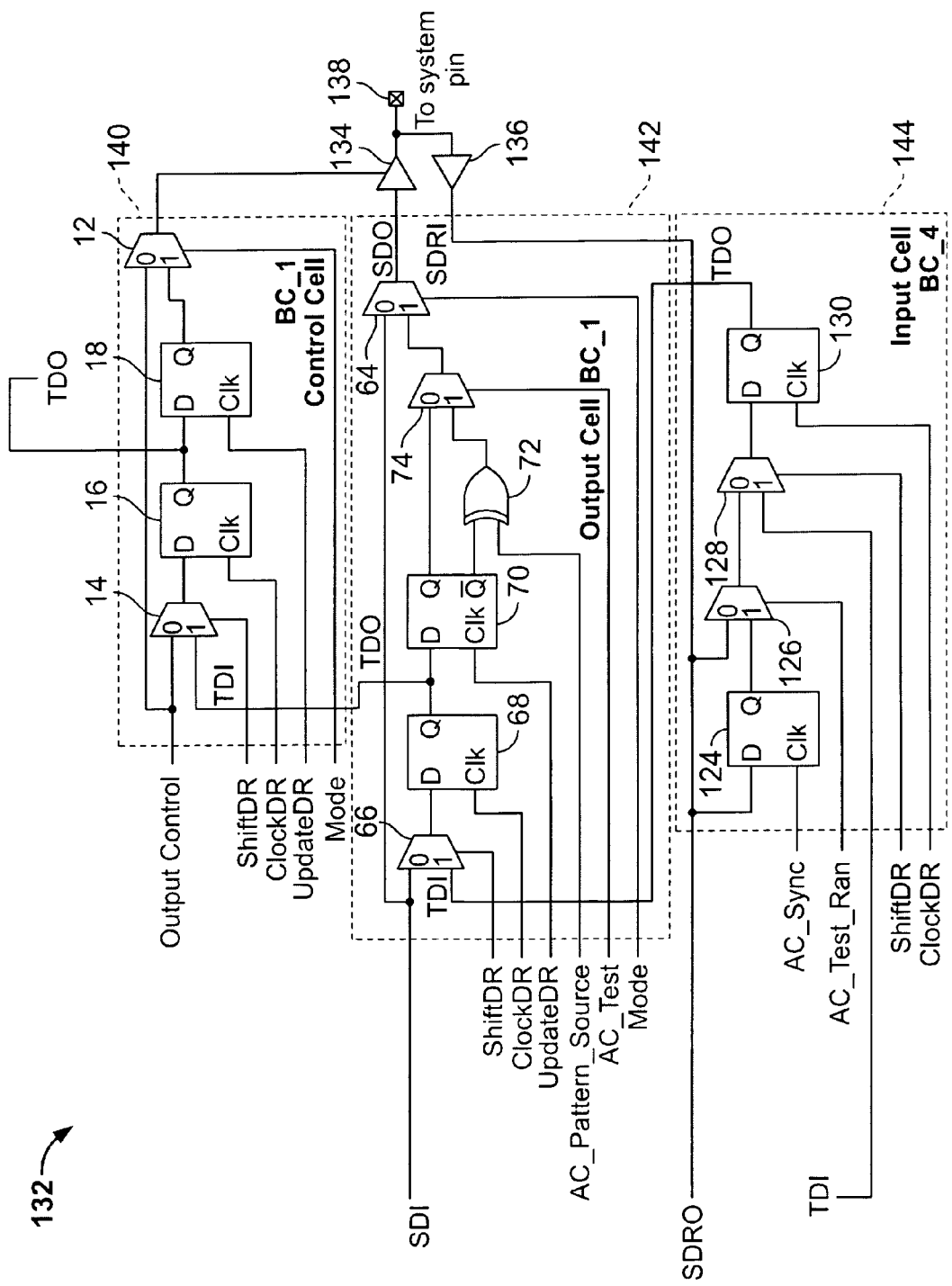
FIG. 14 is a detailed logic block diagram of a bi-directional AC BSC according to one embodiment of the present invention.

Turning now to FIG. 14, a detailed logic block diagram of a bi-directional AC BSC 132 according to one embodiment of the present invention is shown. In addition to the BSC 132, an output buffer 134, an input buffer 136, an I/O pin 138, and a control cell 140 are shown for greater clarity. The control cell 140 is similar to the BSC 10 of FIG. 1. The BSC 132 includes an output cell 142 and an input cell 144. The output cell 142 is similar to the BSC 62 of FIG. 9. The input cell 144 is similar to the BSC 122 of FIG. 13. Since the BSC 132 is bi-directional, it has each of an SDI line, an SDO line, an SDRI line, and an SDRO line. As always, the BSC 132 has a TDI line and a TDO line. Each line is coupled to receive the corresponding signal from the boundary scan logic. The various lines and circuit elements are coupled to one another as shown.

Figure 15:
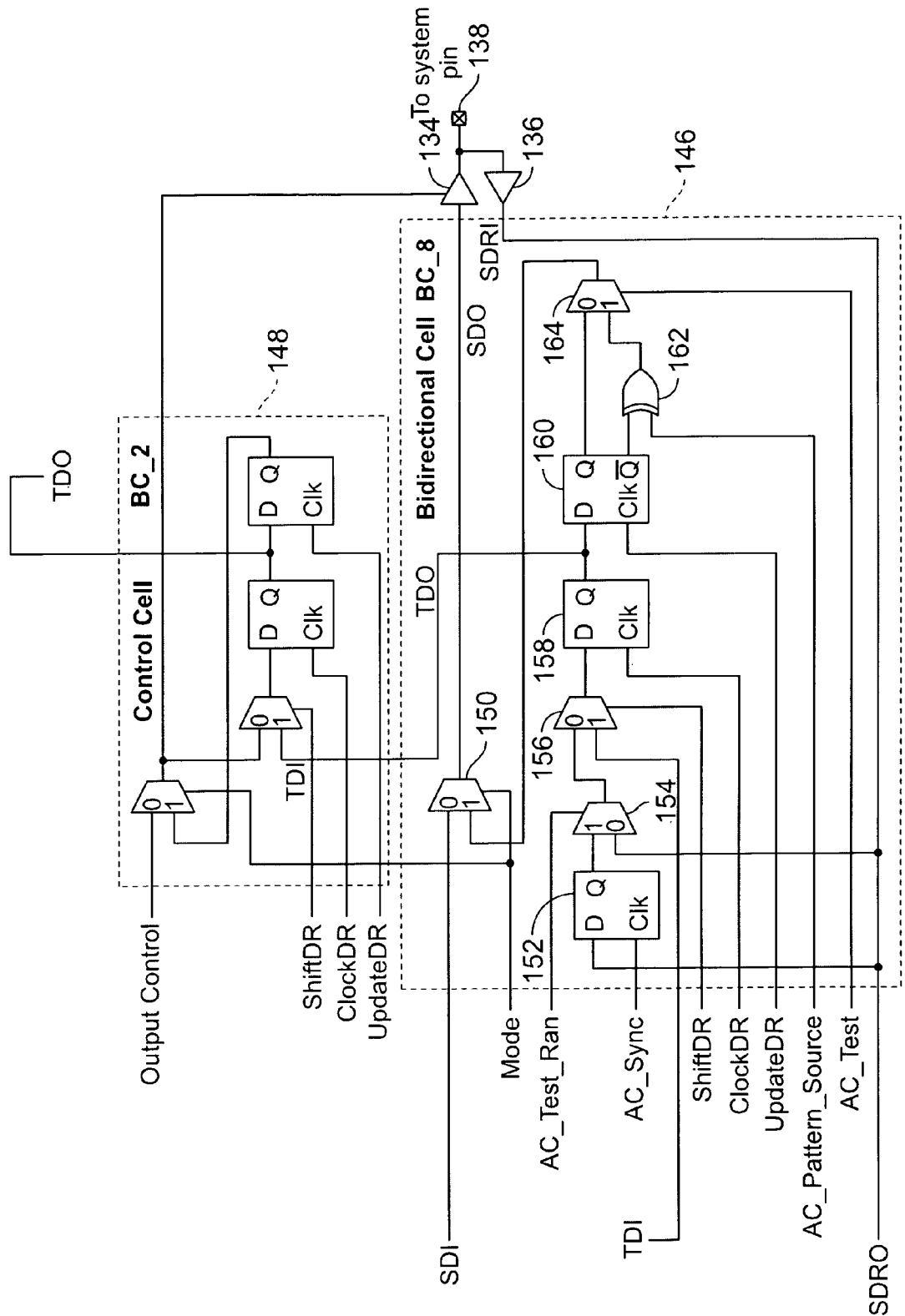
FIG. 15 is a detailed logic block diagram of a bi-directional AC BSC according to one embodiment of the present invention.

Turning now to FIG. 15, a detailed logic block diagram of a bi-directional AC BSC 146 according to one embodiment of the present invention is shown. As above, the output buffer 134, the input buffer 136, and the I/O pin 138 are shown for greater clarity. In this case, a different control cell 148 is shown. The control cell 148 is of conventional design as shown. The BSC 146 includes a first multiplexer 150, a first data shift register 152, a second multiplexer 154, a third multiplexer 156, a second data register 158, a third data shift register 160, a XOR logic gate 162, and a fourth multiplexer 164. As above, the BSC 146 has an SDI line, an SDO line, an SDRI line, an SDRO line, a TDI line, and a TDO line. The BSC 146 also includes a Mode signal input line, an AC_Test_Ran signal input line, an AC_Sync signal input line, a ShiftDR signal input line, a ClockDR signal input line, an UpdateDR signal input line, an AC_Pattern_Source signal input line, and an AC_Test signal input line. Each line is coupled to receive the corresponding signal from the boundary scan logic. The various lines and circuit elements are coupled to one another as shown.

Figure 16:
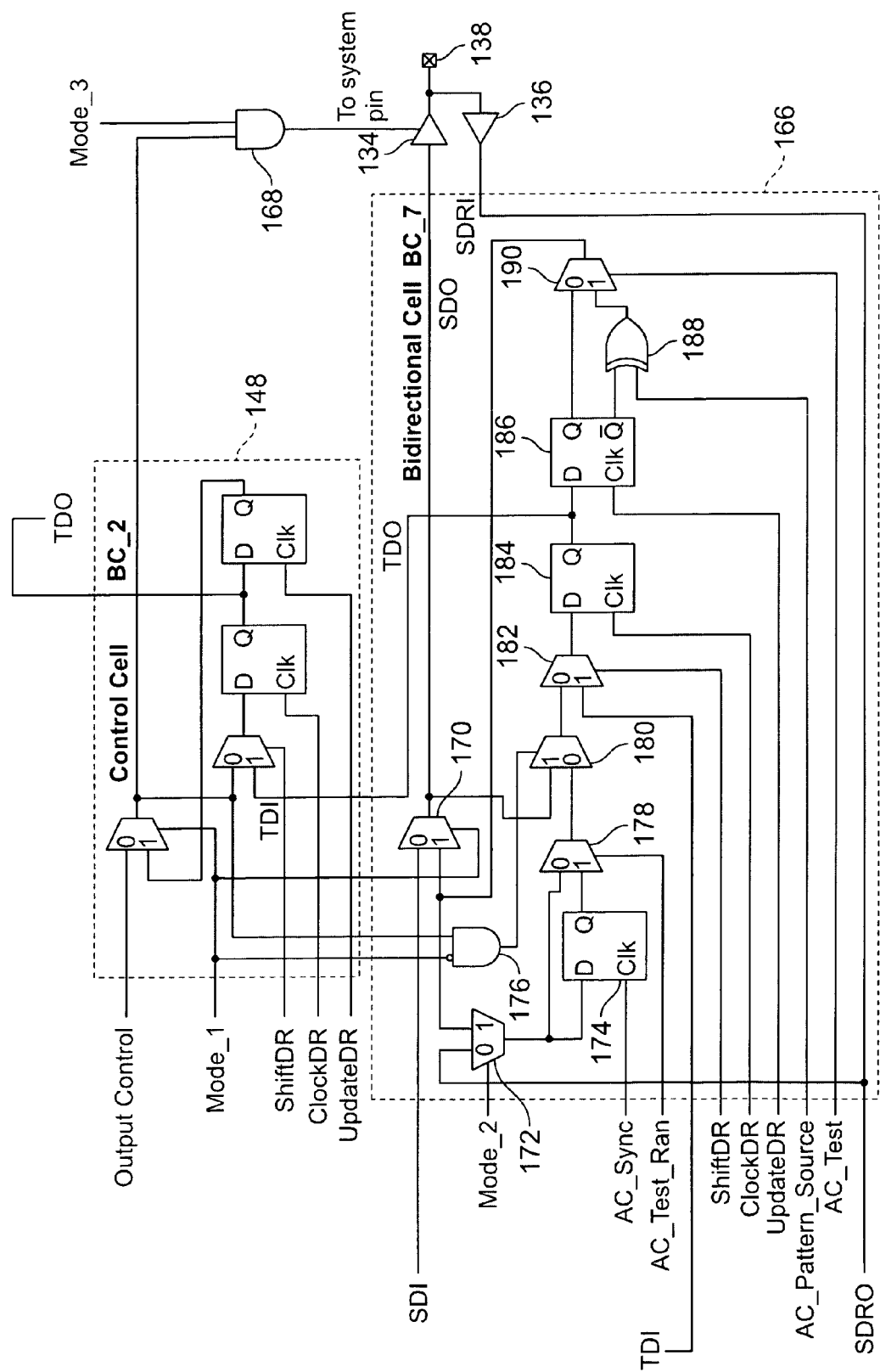
FIG. 16 is a detailed logic block diagram of a bi-directional AC BSC according to one embodiment of the present invention.

Turning now to FIG. 16, a detailed logic block diagram of a bi-directional AC BSC 166 according to one embodiment of the present invention is shown. As above, the output buffer 134, the input buffer 136, the I/O pin 138, and the control cell 148 are shown for greater clarity. As above, the control cell 148 is of conventional design. In addition, an AND logic gate 168 is shown having a Mode_3 signal input line coupled to a first input. The BSC 166 includes a first multiplexer 170, a second multiplexer 172, a first data shift register 174, an AND logic gate 176 with one input inverted, a third multiplexer 178, a fourth multiplexer 180, a fifth multiplexer 182, a second data register 184, a third data register 186, a XOR logic gate 188, and a sixth multiplexer 190. As above, the BSC 166 has an SDI line, an SDO line, an SDRI line, an SDRO line, a TDI line, a TDO line, an AC_Sync signal input line, an AC_Test_Ran signal input line, a ShiftDR signal input line, a ClockDR signal input line, an UpdateDR signal input line, an AC_Pattern_Source signal input line, and an AC_Test signal input line. In addition, the BSC 166 includes a Mode_1 signal input line and a Mode_2 signal input line. Each line is coupled to receive the corresponding signal from the boundary scan logic. The various lines and circuit elements are coupled to one another as shown.

An AC_Test signal and an AC_Test_Ran signal can be gated with the update data register of other BSCs to force the signals into an inactive state. In this application, BSCs used to disable an AC_Test signal or an AC_Test_Ran signal are AC_EXTEST control cells which are referred to as a type "INTERNAL" in function element value under the Boundary Scan Description Language register description section. With this functionality, one can selectively disable or enable a group or individual AC BSCs from performing AC_EXTEST by loading an appropriate value into the AC_EXTEST control cell.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for testing interconnections of a circuit having at least one DC coupled interconnection and at least one AC coupled interconnection, the circuit having at least one driving IC and at least one receiving IC that are capacitively coupled together by at least one AC coupled interconnection, each IC having a plurality of boundary scan cells (BSCs), an instruction register, and a TAP controller, the method comprising the steps of:

evaluating a test type signal and effecting an AC interconnection test if the test type signal is set, the AC interconnection test comprising:

shifting an AC test stimulus into the BSCs of the at least one driving IC, the AC test stimulus having a plurality of voltage transitions;

scanning an initiate AC test instruction into the instruction register of both ICs;

performing an execute AC test instruction by moving the TAP controller to the Run-Test/Idle state and holding the TAP controller of both ICs in the Run-Test/Idle state for the time required to complete execution of the AC test instruction, wherein, during the Run-Test/Idle controller state, the at least one driving IC is applying the AC test stimulus to the at least one AC coupled interconnection and the at least one receiving IC is sampling a received signal embodying captured AC test instruction results;

transferring the captured AC test instruction results into the BSCs of the at least one receiving IC;

scanning out the captured AC test instruction results if the Test type signal is set; and;

effecting a DC interconnection test if the test type signal is not set.

2. The method as defined in claim 1, wherein the AC interconnection test further comprises the step of evaluating the captured AC test instruction results.

3. The method as defined in claim 1, wherein the AC interconnection test further comprises the step of generating a second AC test stimulus and repeating the steps of shifting, scanning, performing, transferring and scanning out with the second AC test stimulus.

4. The method as defined in claim 3, wherein the AC interconnection test further comprises the step of evaluating the captured AC test instruction results for the second AC test stimulus.

5. A system for testing interconnections of a circuit having at least one DC coupled interconnection and at least one AC coupled interconnection, the circuit having at least one driving IC and at least one receiving IC that are capacitively coupled together by at least one AC coupled interconnection, each IC having a plurality of boundary scan cells (BSCs), an instruction register, and a TAP controller, the system comprising:

means for evaluating a test type signal initiating an AC interconnection test if the test type signal is set and initiating a DC interconnection test if the test type signal is not set;

means for shifting an AC test stimulus into the BSCs of the at least one driving IC, the AC test stimulus having a plurality of voltage transitions;

means for scanning an initiate AC test instruction into the instruction register of both ICs;

means for performing an execute AC test instruction by moving the TAP controller to the Run-Test/Idle state and holding the TAP controller of both ICs in the Run-Test/Idle state for the time required to complete execution of the AC test instruction, wherein, during the Run-Test/Idle controller state, the at least one driving IC is applying the AC test stimulus to the at least one AC coupled interconnection and the at least one receiving IC is sampling a received signal embodying captured AC test instruction results;

means for transferring the captured AC test instruction results into the BSCs of the at least one receiving IC;

means for scanning out the captured AC test instruction results; and means for effecting a DC interconnection test.

6. The system as defined in claim 5, further comprising means for evaluating the captured AC test instruction results.

7. The system as defined in claim 5, further comprising means for generating a second AC test stimulus.

8. The system as defined in claim 7, further comprising means for evaluating the captured AC test instruction results for the second AC test stimulus.

9. A system for testing interconnections of a circuit having at least one DC coupled interconnection and at least one AC coupled interconnection comprising:

at least one driving IC having a plurality of boundary scan cells (BSCs), an instruction register, and a TAP controller;

at least one receiving IC having a plurality of BSCs, an instruction register, and a TAP controller;

at least one AC coupled interconnection that capacitively couples the at least one driving IC to the at least one receiving IC;

at least one DC coupled interconnection; and a test type signal generator configured to generate a test type signal;

wherein the BSCs of the at least one driving IC are capable of receiving an AC test stimulus having a plurality of voltage transitions, the instruction register of both ICs are capable of receiving an initiate AC test instruction, the TAP controller of both ICs is capable of being moved to and held in the Run-Test/Idle state for the time required to complete execution of the AC test instruction, wherein, during the Run-Test/Idle controller state, the at least one driving IC is applying the AC test stimulus to the at least one AC coupled interconnection and the at least one receiving IC is sampling a received signal embodying captured AC test instruction results, and the BSCs of the at least one receiving IC are capable of receiving and scanning out the captured AC test instruction results if the test type signal is set, and wherein a DC interconnection test is effected if the signal is not set.

10. A method for testing interconnections of a circuit having at least one DC coupled interconnection and at least one AC coupled interconnection, comprising:

evaluating a test type signal;

effecting an AC interconnection test if the test type signal is set; and effecting a DC interconnection test if the test type signal is not set.

11. The method of claim 10 wherein the circuit includes at least one driving IC and at least one receiving IC that are capacitively coupled together by at least one AC coupled interconnection, each IC having a plurality of boundary scan cells (BSCs), an instruction register, and a TAP controller, and the AC interconnection test includes shifting an AC test stimulus into the BSCs of the at least one driving IC, the AC test stimulus having a plurality of voltage transitions, scanning an initiate AC test instruction into the instruction register of both ICs, performing an execute AC test instruction by moving the TAP controller to the Run-Test/Idle state and holding the TAP controller of both ICs in the Run-Test/Idle state for the time required to complete execution of the AC test instruction, wherein, during the Run-Test/Idle controller state, the at least one driving IC is applying the AC test stimulus to the at least one AC coupled interconnection and the at least one receiving IC is sampling a received signal embodying captured AC test instruction results, transferring the captured AC test instruction results into the BSCs of the at least one receiving IC, scanning out the captured AC test instruction results and evaluating the captured AC test instruction results.

12. A system for testing interconnections of a circuit having at least one DC coupled interconnection and at least one AC coupled interconnection, comprising:
- means for evaluating a test type signal;
- means for effecting an AC interconnection test if the test type signal is set; and
- means for effecting a DC interconnection test if the test type signal is not set.

13. The system of claim 12 wherein the circuit includes at least one driving IC and at least one receiving IC that are capacitively coupled together by at least one AC coupled interconnection, each IC having a plurality of boundary scan cells (BSCs), an instruction register, and a TAP controller, and the AC interconnection test includes shifting an AC test stimulus into the BSCs of the at least one driving IC, the AC test stimulus having a plurality of voltage transitions, scanning an initiate AC test instruction into the instruction register of both ICs, performing an execute AC test instruction by moving the TAP controller to the Run-Test/Idle state and holding the TAP controller of both ICs in the Run-Test/Idle state for the time required to complete execution of the AC test instruction, wherein, during the Run-Test/Idle controller state, the at least one driving IC is applying the AC test stimulus to the at least one AC coupled interconnection and the at least one receiving IC is sampling a received signal embodying captured AC test instruction results, transferring the captured AC test instruction results into the BSCs of the at least one receiving IC, scanning out the captured AC test instruction results and evaluating the captured AC test instruction results.

\* \* \* \* \*